United States Patent [19]
Jaffe et al.

[11] 4,003,127
[45] Jan. 18, 1977

[54] POLYCRYSTALLINE SILICON PRESSURE TRANSDUCER

[75] Inventors: James M. Jaffe, Southfield; John Y. W. Seto, Warren, both of Mich.

[73] Assignee: General Motors Corporation, Detroit, Mich.

[22] Filed: Sept. 26, 1975

[21] Appl. No.: 616,959

Related U.S. Application Data

[60] Division of Ser. No. 526,580, Nov. 25, 1974, Pat. No. 3,938,775, which is a continuation-in-part of Ser. No. 463,515, April 24, 1974, abandoned.

[52] U.S. Cl. ............................ 29/580; 29/591; 29/610 SG
[51] Int. Cl.² ........................................ B01J 17/00
[58] Field of Search .............. 29/580, 610 SG, 591

[56] References Cited
UNITED STATES PATENTS

| | | | |
|---|---|---|---|
| 3,734,770 | 5/1973 | Price | 427/86 |
| 3,858,150 | 12/1974 | Gurtler | 29/580 |

Primary Examiner—W. Tupman
Attorney, Agent, or Firm—Robert J. Wallace

[57] ABSTRACT

A semiconductor pressure transducer having a polycrystalline silicon diaphragm providing an extremely pressure sensitive and temperature stable device, and a method of making the same. The polycrystalline silicon can easily be vapor deposited on an etch resistant layer covering a surface of a wafer or base, preferably monocrystalline silicon. Such vapor deposition of the polycrystalline silicon more accurately and consistently defines the thickness of the diaphragm than can be obtained by grinding or etching. A pressure responsive resistor formed in the diaphragm is automatically electrically isolated by the comparatively high resistivity of the polycrystalline silicon. Accordingly, PN junction isolation and passivating oxides on the diaphragm are not required thereby resulting in increased temperature stability.

2 Claims, 4 Drawing Figures

POLYCRYSTALLINE SILICON PRESSURE TRANSDUCER

CROSS REFERENCE TO RELATED APPLICATIONS

This application is a division of U.S. patent application Ser. No. 526,580 entitled "Polycrystalline Silicon Pressure Transducer", filed Nov. 25, 1974, in the names of James M. Jaffe and John Y. W. Seto, now U.S. Pat. No. 3,938,775, and assigned to the assignee of this application. The aforesaid U.S. Ser. No. 526,580 is a continuation-in-part of U.S. patent application Ser. No. 463,515 filed Apr. 24, 1974 now abandoned.

BACKGROUND OF THE INVENTION

This invention relates to semiconductor pressure responsive devices. More particularly, it relates to a semiconductor pressure transducer having an extremely thin vapor deposited polycrystalline silicon diaphragm, and to a method of making it.

Semiconductor pressure transducers are currently gaining wide acceptance in a variety of commercial pressure sensing applications. Semiconductor pressure transducers apply the principle that the electrical resistance of resistor in a thin semiconductor diaphragm changes as the function of diaphragm stress due to pressure differentials on either side of the diaphragm. The sensitivity of the devices depend generally on such factors as the thickness of the diaphragm and the piezoresistive gauge factor of the material used for the diaphragm. Commercially available prior art semiconductor pressure transducers have used single crystal or monocrystalline silicon for the diaphragm. That is, the diaphragm consists of a single, unitary crystal having no grain or crystal boundaries throughout the body. Until now, it was generally accepted that monocrystalline silicon was the most practical diaphragm material which could be used in order to achieve the sensitivity required for most applications.

It has been recognized that for optimum linear response of the pressure transducer, the pressure responsive resistor should be electrically insulated or isolated from the diaphragm and supporting structure. However, the highest commercially available resistivity for monocrystalline silicon is of the order of about $10^2$ ohm-centimeter. Therefore, such monocrystalline silicon cannot be readily used for electrical isolation of the pressure responsive resistor. Such isolation has been generally provided by diffusing the monocrystalline silicon with impurities of one conductivity type and by forming the pressure responsive resistor by diffusing impurities of an opposite conductivity type into the diaphragm to provide a PN junction therebetween.

However, certain inherent problems exist with such PN junction isolation. For example, if the PN junction is exposed to ambient conditions, the junction can become contaminated. To alleviate this condition a passivating oxide coating is ordinarily applied over the exposed PN junction. However, this introduces an additional difficulty because the passivating oxide has a different coefficient of thermal expansion than the monocrystalline silicon diaphragm, which imparts undesirable temperature dependence on the response of the device. That is, the output of the device may vary with a change in temperature although there is no change in the pressure being sensed.

In making these monocrystalline silicon diaphragms, one would remove selected portions of a monocrystalline silicon wafer by etching, grinding, lapping or polishing to define the desired thickness for the various diaphragms to be produced from the wafer. However, using these processes one could not readily form diaphragms having a uniform thickness of less than 10 microns. Therefore, the sensitivity of these monocrystalline silicon diaphragms is limited by this parameter. Furthermore, the thickness of the diaphragm is not accurately controllable by these manufacturing techniques. Therefore, consistent reproducibility of extremely thin diaphragms in high volume production is not obtainable using these prior art methods.

OBJECTS AND SUMMARY OF THE INVENTION

It is therefore an object of this invention to provide a semiconductor pressure transducer having a polycrystalline silicon diaphragm which provides extreme sensitivity and temperature stability for the transducer, and a method of making the same.

It is a further object of this invention to provide a polycrystalline silicon diaphragm for a semiconductor pressure transducer and a method of making the same, wherein a pressure responsive resistor formed in the polycrystalline silicon diaphragm is automatically electrically isolated by the high resistivity polycrystalline silicon.

It is a further object of this invention to provide a semiconductor pressure transducer and a method for making the same, wherein an extremely thin diaphragm thickness is accurately and consistently controllable by vapor deposition of a polycrystalline silicon film which serves as the diaphragm.

This invention further resides in features of combination and construction, both as to the structure of the transducer and as to its method of manufacture, that permit the effective and comparatively low cost manufacture of the device through use of well known semiconductor manufacture techniques while providing a device that is small, sensitive and suitable for use in a wide variety of commercial applications.

In brief, the transducer of the present invention has an extremely thin film of intrinsic polycrystalline silicon that bridges an aperture in a supporting semiconductor base member thereby providing a sensitive polycrystalline silicon diaphragm for the transducer. An elongated doped region formed in the polycrystalline silicon diaphragm provides a pressure responsive resistor which is automatically electrically isolated by the high resistivity polycrystalline silicon. Therefore, neither PN junction isolation nor a passivating oxide layer is required, thereby increasing the temperature stability of the device. In its process aspects, the present invention advantageously uses a layer of etch resistant material formed on the base member for the dual purpose of controlling the etching by which the aperture is formed for the reverse side of the base member, and to provide the situs for vapor depositing a polycrystalline (as distinguished from monocrystalline) film bridging the aperture. The vapor deposition of the polycrystalline silicon film accurately and consistently controls the desired diaphragm thickness. Hence, many pressure transducers can be reproducibly manufactured having a uniform, but extremely small diaphragm thickness within close tolerances during high volume production.

DESCRIPTION OF THE PREFERRED EMBODIMENT

For ease of description, the method of this invention will be described in connection with preparing but one semiconductor pressure transducer. However, it should be realized that in production many pressure transducers can be produced simultaneously as part of a wafer as is well known in semiconductor technology. Base member 10 represents a portion of such a wafer. Base member 10 serves as a support for the diaphragm to be formed for the pressure transducer. Preferably, base member 10 is monocrystalline silicon having a thickness of about 4–6 mils. If desired, other materials, such as sapphire, having a coefficient of thermal expansion similar to polycrystalline silicon may be used.

Figure 2:
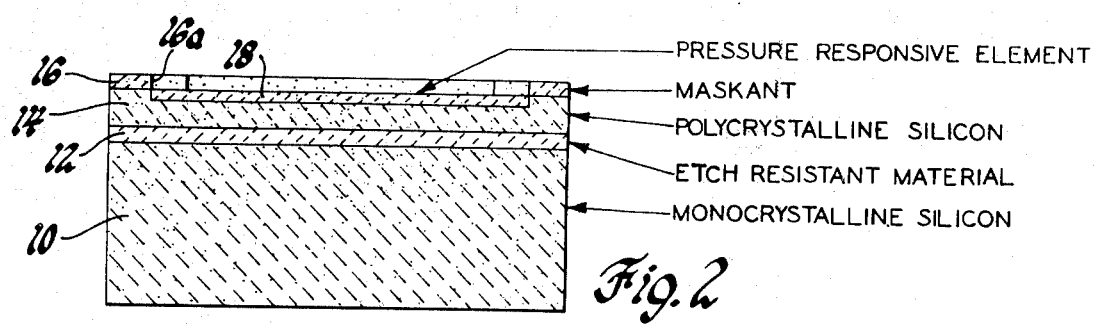
FIG. 2 shows a sectional view of the device of FIG. 1 at an intermediate stage of making the device.

Referring now especially to FIG. 2, an etch resistant layer 12 is formed on the top surface of base member 10. Preferably, etch resistant layer 12 is silicon dioxide which is grown by thermal oxidation to a thickness of about 4000 A. As etch resistant layer 12 and the remaining portions of the pressure transducer are extremely small, they will be shown with exaggerated thicknesses for purposes of illustration. Etch resistant layer 12 serves as an automatic stop when the base member 10 is etched from its back side to form an aperture therein. The etch resistant layer 12 also promotes vapor deposition of polycrystalline silicon thereon. Other etch-resistant materials having the ability to form a polycrystalline silicon film, such as a 400 A thick silicon nitride layer, can be used as a substitute for silicon dioxide.

An extremely thin polycrystalline silicon film 14 is vapor deposited on etch resistant layer 12. Preferably, polycrystalline silicon film 14 is deposited or grown by thermal decomposition of silane in an inert gas atmosphere at about 600°–900° C. For example, base member 10 with etch resistant layer 12 thereon may be placed in a closed container, heated to approximately 650° C., and a mixture of silane ($SiH_4$) and argon (Ar) introduced into the container. After this gaseous mixture flows over the etch resistant layer 12 for about 50 minutes, a polycrystalline silicon film 14 of about 3 microns thick is deposited. The thickness of polycrystalline silicon film 14 is the same as the diaphragm to be produced for the pressure transducer. Smaller or larger diaphragm thicknesses can be vapor deposited if desired, for example, by increasing the temperature or time. In fact, diaphragm thicknesses less than 1 micron can be produced using the method of our invention. Regardless, for a given set of parameters one will always produce the same polycrystalline silicon film thickness, within ± 5% tolerance. The film 14 is polycrystalline as distinguished from monocrystalline, because the silicon dioxide serving as etch resistant layer 12 has an amorphous crystallograhic structure which forms a plurality of randomly oriented sites for crystal formation that are not uniformly oriented so as to grow a single crystal. In contrast, a silicon film formed directly over the monocrystalline silicon base member 10 tends to grow in single crystal or monocrystalline form.

A maskant layer 16, such as silicon dioxide, is formed on the top side of the polycrystalline silicon film 14. Preferably, maskant layer 16 has a thickness of about 8000 A, depending on the maskant material used and the method of introducing pressure responsive resistors or other electronic devices into polycrystalline silicon film 14. Using standard photolithographic techniques, maskant layer 16 is selectively etched down to polycrystalline silicon film 14 to define a window 16a, preferably in the form of an elongated rectangle which spans the centrally located portion of polycrystalline silicon film 14. For example, a KMER mask (not shown) can be formed on maskant layer 16 to define a window selectively exposing maskant layer 16 in the desired shape. Then the exposed portions of the maskant layer 16 are etched through the window down to polycrystalline silicon film 14. This forms window 16a in maskant layer 16 which exposes a centrally located elongated strip in polycrystalline silicon film 14 in the desired shape of a pressure responsive resistor to be subsequently formed therein.

Pressure responsive resistor 18 is formed by diffusion or ion implantation into the top surface of polycrystalline silicon film 14 through window 16a. For example, boron impurities are introduced into polycrystalline silicon film 14 by known diffusion techniques. Thus, pressure responsive resistor 18 is an elongated doped region in the intrinsic polycrystalline silicon film 14. It is a feature of our invention that pressure responsive resistor 18 is automatically electrically isolated by the high resistivity polycrystalline silicon. As an illustrative example, the resistivity of pressure responsive resistor 18 can be of the order of 0.1 ohm-centimeter, whereas the resistivity of the surrounding polycrystalline silicon is of the order of $10^6$ ohm-centimeter.

Figure 3:
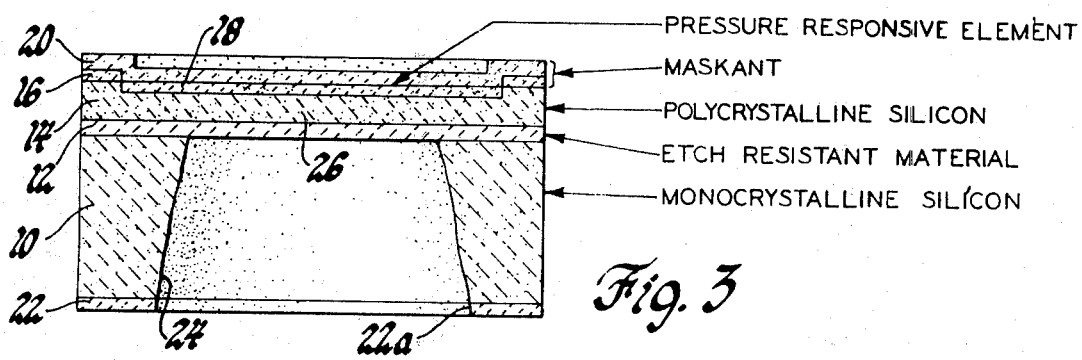
FIG. 3 shows a sectional view of the pressure transducer device during a succeeding step of the method of making it.

Turning now to FIG. 3, after pressure responsive resistor 18 has been formed in polycrystalline silicon film 14 and the KMER maskant removed, another maskant layer 20, for example silicon dioxide, is formed on the top of polycrystalline silicon film 14 to completely cover it. The back side of base member 10 is then masked using a suitable maskant 22, such as silicon dioxide, while leaving exposed a window or opening 22a as seen in FIG. 3. Opening 22a is preferably circular and underlies pressure responsive resistor 18 so that the latter forms a diameter thereof. Base member 10 is then etched from its back side until the etchant reaches the etch resistant material 12. A preferred etchant is potassium hydroxide which readily etches the monocrystalline silicon base member 10, but does not readily attack the silicon dioxide which serves as etch resistant layer 12. As can be seen, a frusto-conical aperture 24 concentric with opening 22a is thus formed in base member 10. The remaining portions of base member 10 provide an annular support for the periphery of polycrystalline film 14. That portion of the polycrystalline film 14 which spans aperture 24 provides a diaphragm 26 for the transducer.

Figure 4:
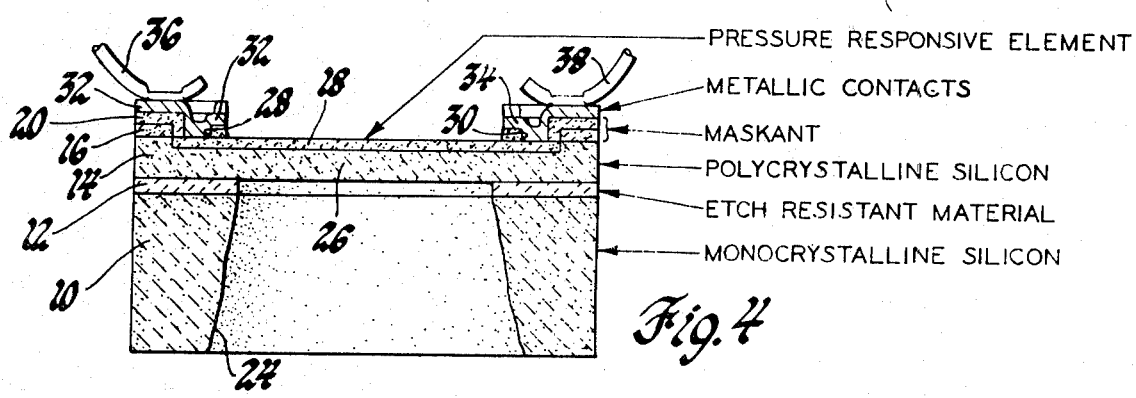
FIG. 4 shows a sectional view along the line 4—4 of FIG. 1.

Turning now especially to FIG. 4, two holes 28 and 30 are etched into maskant layers 16 and 20 to expose the opposite ends of pressure responsive resistor 18 in diaphragm 26. Metallic contacts 32 and 34 are then formed thereon to make the electrical connection to pressure responsive resistor 18. This can be accomplished by standard evaporation techniques. Metallic contacts 32 and 34 can be bi-layered (not shown) having a first layer of chromium and a superimposed layer of gold thereon. It should be noted that other metals can be used that will adhere to the silicon dioxide and the pressure responsive resistor 18.

Figure 1:
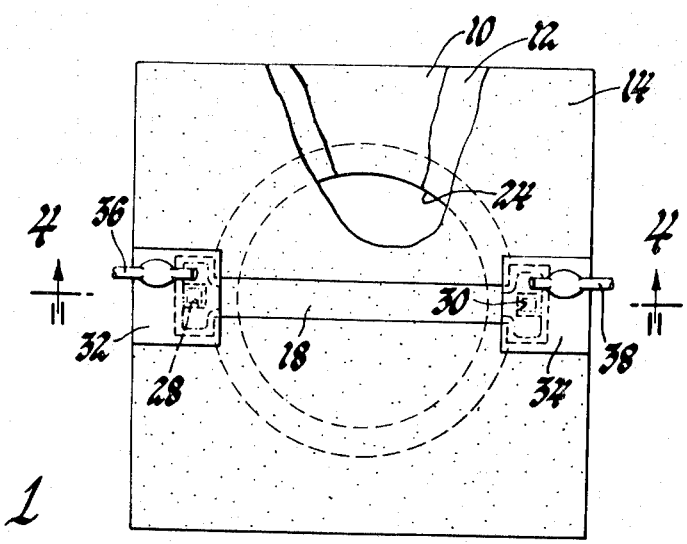
FIG. 1 shows a top plan view with parts broken away of an illustrative embodiment of the pressure transducer device of this invention.

The silicon dioxide used for maskant layers 16, 20 and etch resistant layer 12 is then removed from both sides of polycrystalline silicon diaphragm 26, for example, by immersing the device into hydrofluoric acid. As can be seen in FIGS. 1 and 4, there is no silicon dioxide on the polycrystalline silicon diaphragm 26. Hence, polycrystalline silicon diaphragm 26 is noncontiguous in any material having a dissimilar coefficient of thermal expansion. Consequently, the temperature stability of the transducer is considerably improved. Wire connections 36 and 38 can be attached to metal contacts 32 and 34, respectively, as by thermal compression bonding. Wires 36 and 38 provide electrical interconnection or access between external circuitry and the pressure transducer.

As just described in the method of our invention, polycrystalline silicon diaphragm 26 can be made extremely thin. Accordingly, the thin diaphragm is easily flexed in response to applied pressure differentials. Such flexure will produce strain in pressure responsive resistor 18, which in turn changes its resistance as a linear function of the pressure being sensed. Hence, the change in resistance of pressure responsive resistor 18 will be extremely sensitive to applied pressure differentials. Consequently, for a given pressure differential to be sensed, the pressure transducer can be of small size as compared to prior art pressure transducers. For example, polycrystalline silicon diaphragm 26 as shown in FIGS. 3–4 can be made less than 0.02 inch in diameter.

It is also a feature of this invention that the thickness of diaphragm 26 is accurately and consistently controllable. Vapor deposition of the polycrystalline silicon film 14 provides an extremely accurate and reproducibly controllable method of producing diaphragms of a desired thickness. Hence, high volume production of extremely thin diaphragms within close tolerances is now obtainable using the method of our invention.

Moreover, the pressure transducer of the present invention requires no PN junction to isolate pressure responsive resistor 18 from diaphragm 26, as is necessary in monocrystalline devices. This is because the intrinsic polycrystalline silicon provides extremely high resistivity surrounding isolation for the doped pressure responsive resistor 18 of comparatively low resistance. Accordingly, passivating oxide layers on the diaphragm 26 are also not required. Therefore, the transducer of this invention is more temperature independent or stable than devices having PN junction isolation necessitating passivating oxides. In contrast, our invention provides a transducer in which no materials having a different coefficient of thermal expansion are contiguous the diaphragm.

What we claim as new and desire to secure by Letters Patent of the United States is:

1. A method of accurately and consistently making an extremely sensitive and temperature stable semiconductor pressure transducer having a thin vapor deposited polycrystalline silicon diaphragm, said method comprising:
forming on one surface of a supporting semiconductor wafer a layer of etch-resistant material having a crystallographic structure which promotes vapor deposition of polycrystalline silicon;
vapor depositing an extremely thin, high resistivity polycrystalline silicon film of a predetermined thickness on said etch-resistant layer wherein said vapor deposition of polycrystalline silicon consistently and accurately defines the thickness of a diaphragm for said pressure transducer;
forming a pressure responsive electronic device into centrally located portions of said polycrystalline silicon film wherein said electronic device is automatically electrically isolated by said high resistivity polycrystalline silicon;
etching said semiconductor wafer from its opposite surface to remove central portions of said wafer in a predetermined geometry corresponding to a desired geometry for said diaphragm;
stopping the etch upon exposure of corresponding portions of said etch-resistant layer thereby defining a polycrystalline silicon diaphragm being peripherally supported by the remaining portions of said wafer;
removing said exposed portions of said etch-resistant layer from one surface of said polycrystalline silicon diaphragm and any oxide-based coating on its opposite surface, thereby providing a temperature stable diaphragm which is noncontiguous with any material having a dissimilar coefficient of thermal expansion; and
applying electrical contacts to said pressure responsive electronic device thereby providing electrical access to said pressure transducer.

2. A method of accurately and consistently making an extremely sensitive and temperature stable semiconductor pressure transducer having a thin vapor deposited polycrystalline silicon diaphragm, said method comprising:
providing a monocrystalline silicon wafer having two major parallel faces;
forming a silicon dioxide layer on one face of said wafer, said silicon dioxide layer serving both as an etchant resist and as a situs for vapor deposition of polycrystalline silicon;
flowing a gaseous mixture of silane and an inert gas over said silicon dioxide layer to deposit a high resistivity polycrystalline silicon film of less than about 10 microns thick on said silicon dioxide layer, wherein the thickness of said polycrystalline silicon film defines the thickness of a diaphragm to be produced for said pressure transducer;
diffusing an elongated pressure responsive resistor into said polycrystalline silicon film wherein said resistor is automatically electrically isolated by said high resistivity polycrystalline silicon;
etching said semiconductor wafer from its opposite surface to remove central portions of said wafer in a predetermined geometry corresponding to a desired geometry for said diaphragm;
stopping the etch upon exposure of corresponding portions of said silicon dioxide layer thereby defining a polycrystalline silicon diaphragm being peripherally supported by the remaining portions of said wafer;
removing said exposed portions of said silicon dioxide layer from one surface of said polycrystalline silicon diaphragm and any oxide-based coating on its opposite surface, thereby providing a temperature stable diaphragm which is noncontiguous any material having a dissimilar coefficient of thermal expansion; and
applying electrical contacts to opposite ends of said pressure responsive resistor, thereby providing electrical access to said pressure transducer.

* * * * *